US006388302B1

(12) United States Patent
Galli

(10) Patent No.: US 6,388,302 B1
(45) Date of Patent: May 14, 2002

(54) GROUND COMPATIBLE INHIBIT CIRCUIT

(75) Inventor: Giovanni Galli, Galati Marina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/602,570

(22) Filed: Jun. 22, 2000

(30) Foreign Application Priority Data

Jun. 22, 1999 (IT) ........................................ MI99A1387

(51) Int. Cl.[7] ................................................ H01L 29/00

(52) U.S. Cl. ......................... 257/498; 257/497; 327/78; 327/535; 327/536

(58) Field of Search ................................ 257/497, 498; 327/535–536, 77–78, 142–3, 564

(56) References Cited

U.S. PATENT DOCUMENTS 4,736,271 A * 4/1988 Mack et al. .................. 361/56
5,485,109 A * 1/1996 Dobkin et al. ................ 327/77

FOREIGN PATENT DOCUMENTS

JP 03058614 A * 3/1991 .................. 327/78

* cited by examiner

*Primary Examiner*—Minh Loan Tran
*Assistant Examiner*—Thomas L Dickey
(74) *Attorney, Agent, or Firm*—Lisa K. Jorgenson; Robert Iannucci; Seed IP Law Group PLLC

(57) ABSTRACT

The invention relates to a ground-compatible inhibit circuit structure and method, for circuits integrated in a semiconductor substrate which is unrelated to ground potential. The circuit structure is integrated in the same substrate as an associated circuit to be inhibited, and the substrate is covered with an epitaxial layer accommodating the components of the inhibit circuit structure. It includes a stable internal voltage reference and a circuit portion for comparing this reference with an inhibit signal in order to block the associated circuit upon a predetermined threshold value being exceeded, even in a condition of the signal potential being higher than the supply potential to the circuit. Advantageously, the epitaxial layer of each well is always at a potential higher than or equal to that of the substrate.

12 Claims, 6 Drawing Sheets

GROUND COMPATIBLE INHIBIT CIRCUIT

TECHNICAL FIELD

This invention relates to a ground-compatible inhibit circuit structure for integrated circuits that are integrated in a semiconductor substrate which is not referenced to a ground potential. The circuit structure is integrated in the same substrate as an associated circuit to be inhibited, and the substrate is covered with an epitaxial layer which accommodates the components of the inhibit circuit structure.

The invention also relates to a method of providing a ground-compatible inhibit function for integrated circuits that are integrated in a semiconductor substrate unreferenced to ground potential, and, more particularly, the invention is directed toward a circuit structure serving a ground-referred inhibit function in electronic circuits that are integrated in a semiconductor substrate, which is held at a potential other than the ground potential.

BACKGROUND OF THE INVENTION

There are many integrated circuits which include inhibit circuitry accessible from outside of the circuit through an inhibit pin arranged to receive a voltage signal for activating a blocking function in an integrated circuit to be controlled.

There also are many integrated circuits which are formed in a semiconductor substrate that is held at a higher potential than ground. Typical examples of such circuits are certain adjustable voltage regulators whose output is clamped directly to the substrate.

These circuits can be supplied a lower voltage than the voltage applied to the inhibit pin.

Embodiments of this invention encompass all of the integrated electronic circuits that include an inhibit circuit portion but are formed in substrates unreferenced to ground.

As an example, a pre-printed electronic board may be considered, whereon microprocessors are mounted that include at least two supply lines, one at a voltage of 3.3V and the other at a voltage higher than that. An inhibit signal could be delivered to a microprocessor pin over the latter line.

An electronic circuit which is formed in a semiconductor substrate unrelated to ground requires it to be isolated from the substrate. More particularly, since the electronic devices of the integrated circuit are usually formed in an epitaxial layer overlying the semiconductor substrate, the junction between the substrate and the epitaxial layer must be prevented from becoming forward biased and open to a flow of leakage current toward the substrate.

This may be regarded as a minor problem where resistors are to be formed, since it would suffice for the epitaxial layer to be placed at the highest of the potentials available to the integrated circuit.

However, the problem becomes more serious where active components are to be formed, such as bipolar transistors of the NPN type, which have the epitaxial layer for their collector.

Also, the TTL (Transistor Transistor Logic) family of logic circuits must be ensured compatible levels of the signals input to them, and hence of an inhibit signal, where provided.

In this context, a further demand that inhibit circuitry is expected to fill is a capability to operate even when the supply voltage to the circuit to be controlled is below the voltage applied to the inhibit pin.

Shown in FIG. 1A herein is a voltage regulating circuit of the adjustable type, which has an output terminal OUT coincident with the P-type substrate of the regulator.

FIG. 1B shows instead an adjustable regulator having an output OUT which is held at a voltage of 1.25V with respect to ground GND.

Shown schematically in FIG. 1C is an adjustable regulator whose output OUT is held at a voltage value being set at 1.25V+1.25*(R2/R1) by a voltage divider.

The three examples of conventional regulators given above are based on the output OUT being coincident with the P-type substrate. In this way, the output voltage value is allowed to vary within a given range which extends between a zero minimum value and a maximum value equal to the supply voltage, less the minimum voltage drop across the regulator.

Under this condition, therefore, the PN junction between the substrate and the epitaxial layer will never be forward biased.

If a regulator as mentioned above were associated with ground-compatible inhibit circuitry, the problem would arise of how to refer the circuitry to the ground-unrelated substrate. The inhibit circuitry would have to be connected between the power supply and the external ground of the integrated circuit, as shown in FIG. 2, in order to have external compatibility ensured for the inhibit function.

The inhibit circuitry shown in FIG. 2 is to ensure that the PN junction between the substrate and the epitaxial layer, of each of its components, never becomes forward biased, even if the substrate is biased to a maximum value (Vmax technology−min drop), and has a condition of $V_{INH}>V_{supp}$.

Operational demands of today's integrated circuits require the inhibit circuitry to meet specifications as listed herein below.

Operating Temperature: −50° C. to +150° C.;

Supply Voltage: 2.75V to Vmax technology (e.g. 30V);

P-substrate Voltage: Vout: 0V to Vmax technology−min drop (where, min drop=VBE+VCEsat);

ON-OFF Voltage, e.g., TTL compatible range:
VthONmax=0.8V,
VthOFFmin=2.0V;

Overall Chip $I_{13}$OFF: <100 μA;

Maximum Voltage at Inhibit Pin: 7V;

Maximum Current on Inhibit Pin: <30 μA;

Minimum Hysteresis: 50 mV.

Related schemes for providing inhibit circuitry that would meet the above specifications have proved incapable to prevent the PN substrate/epitaxial junction from becoming forward biased. In fact, there are no adjustable regulators available commercially which have an output voltage Vout clamped to the substrate and that include inhibit circuitry integrated in the same semiconductor.

Until now, no circuit has been developed including inhibit circuitry referred to ground, such as TTL compatible circuitry, in an integrated circuit whose substrate is unrelated to ground and related to a higher potential, and may be supplied a lower voltage than that applied to the inhibit pin.

SUMMARY OF THE INVENTION

Embodiments of this invention provide an integrated circuit structure which has a voltage reference relative to ground and useful for external comparison with an inhibit voltage in order to activate or not an inhibit activation circuit portion referenced to the substrate. The remainder of the integrated circuit is referenced to the substrate. Circuit elements are used in the inhibit circuit portion which have an epitaxial layer of each well always at a potential higher than or equal to that of the substrate, and. which meet a condition of the inhibit voltage greater than the supply voltage. It thus becomes possible to ensure compatibility toward ground with any external interface, as well as ensuring that the substrate is biased with a voltage of the supply voltage less the minimum drop at its maximum, and that the condition of the inhibit voltage greater than the supply voltage are both met.

One embodiment of the invention provides for a ground-compatible inhibit circuit structure in a semiconductor substrate that is not referenced to the ground potential. The structure is integrated in the same substrate as an associated circuit to be inhibited, and the substrate is covered with an epitaxial layer accommodating the components of the inhibit circuit portion. The inhibit circuit includes a stable internal voltage reference and a circuit portion operative to compare the reference with an inhibit signal in order to block the associated circuit upon a predetermined threshold value being exceeded, even in a condition of the signal potential being higher than the supply potential to the circuit.

The features and advantages of a circuit structure according to the invention will be apparent from the following description of an embodiment thereof, given by way of non-limitative example with reference to the accompanying drawings.

DETAILED DESCRIPTION OF THE INVENTION

Figure 1A:
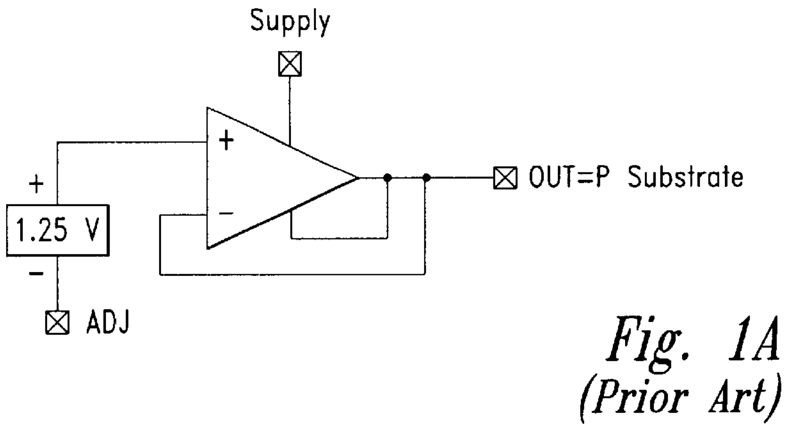
Fig. 1A (Prior Art)
FIGS. 1A, 1B and 1C are schematic diagrams of an adjustable voltage regulator according to the prior art.
Figure 1B:
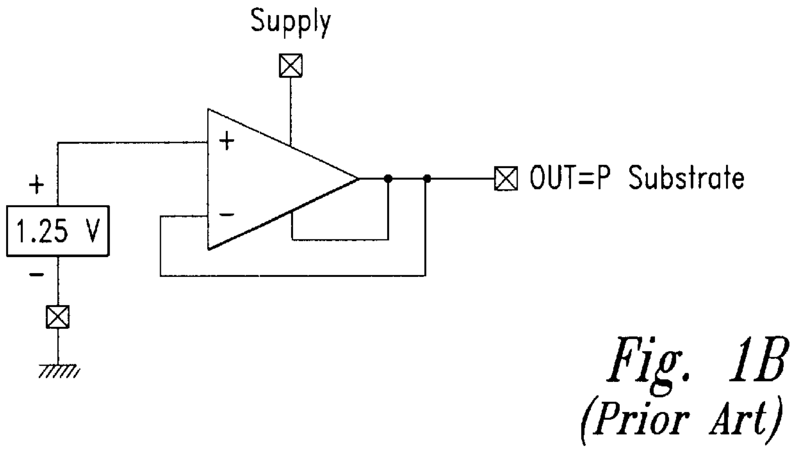
Fig. 1B (Prior Art)
Figure 1C:
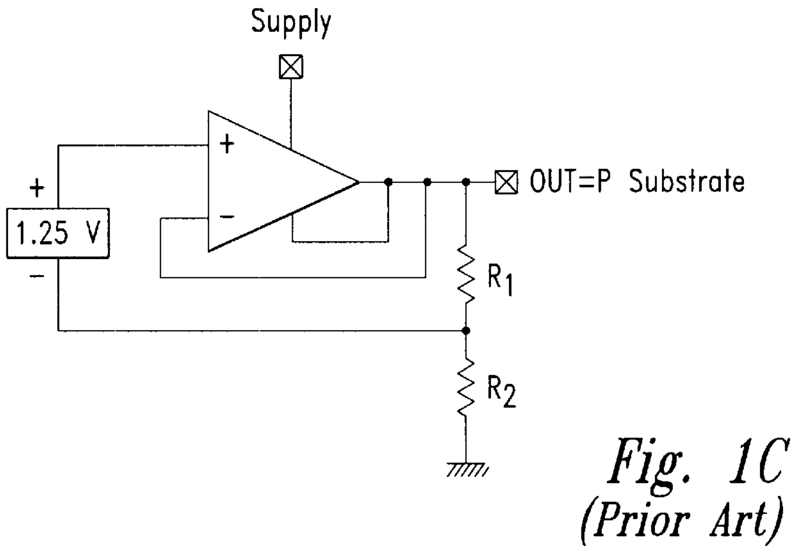
Fig. 1C (Prior Art)
Figure 2:
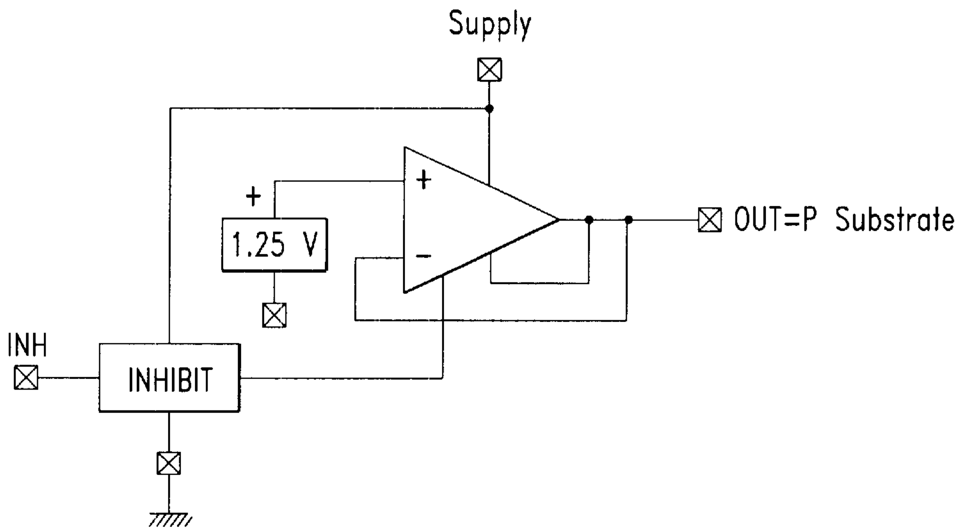
Fig. 2 (Prior Art)
FIG. 2 is a schematic diagram of an integrated regulating circuit associated with conventional inhibit circuitry.
Figure 3:
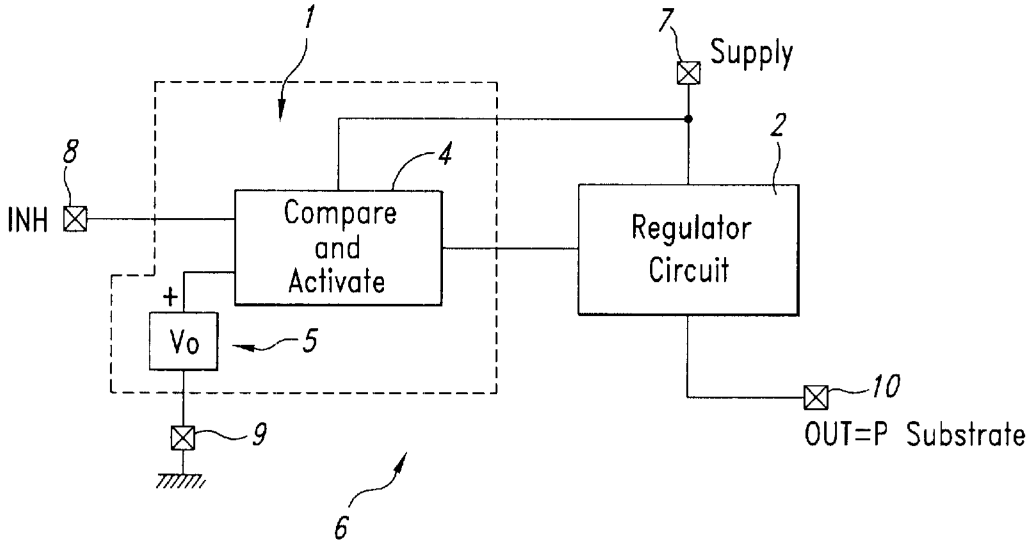
FIG. 3 is a schematic diagram of an adjustable voltage regulator provided with inhibit circuitry according to an embodiment of the invention.

Referring to the drawing views, and in particular to the example of FIG. 3, a circuit structure according to an embodiment of the invention allowing for a inhibit action on a circuit 2 to be controlled, is generally shown at 1 in schematic form. The circuit 2 is an adjustable voltage regulator, for example, although it could be a semiconductor integrated circuit of any other type.

The structure 1 is integrated in a same semiconductor substrate 3 as the circuit 2 with which it forms an integrated electronic device 6 having certain contact terminals or pins.

A first pin 7 is arranged to receive a supply voltage Vs and a second pin 8 is structured to receive an inhibit function activating signal INH, a third pin 9 represents a ground voltage reference GND, and a fourth pin 10 represents an output terminal OUT, which is coincident with the device substrate 3.

Advantageously, the substrate 3 is a P type and unreferenced to the ground voltage reference GND.

A stable reference 5 of a voltage Vo, and a compare/activate circuit portion 4 are provided within the circuit structure 1.

Figure 4:
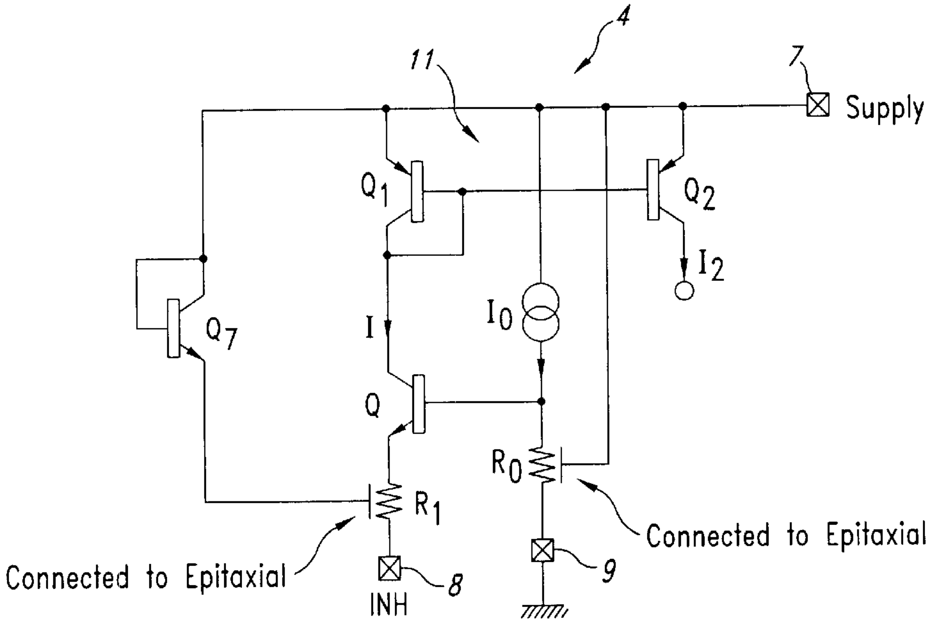
FIG. 4 shows a first exemplary circuit diagram for the inhibit circuitry of FIG. 3.

With reference to the circuit diagram of FIG. 4, the voltage reference 5 can be provided by connecting a current generator lo in series with a resistor Ro, between the supply pin 7 and the ground pin 9.

A transistor Q, which may be a bipolar NPN transistor, has a base terminal connected to an interconnection node between the current generator Io and the resistor Ro.

This transistor Q has a source terminal connected to the inhibit pin 8 via a resistor R1, and has a collector terminal connected to the supply pin 7 via a current mirror 11 formed of a pair of transistors Q1 and Q2, both of the PNP type.

The last-mentioned transistors Q1, Q2 have source terminals connected to the supply pin 7, and have base terminals connected together. The transistor Q1 has its base terminal connected to its collector terminal, itself further connected to a collector of the transistor Q. A mirrored current value I2 is picked up from a collector terminal of the second transistor Q2 in the Q1–Q2 pair.

An additional transistor Q7 is connected in a diode configuration between the supply pin 7 and an epitaxial well of the resistor R1.

Figure 5:
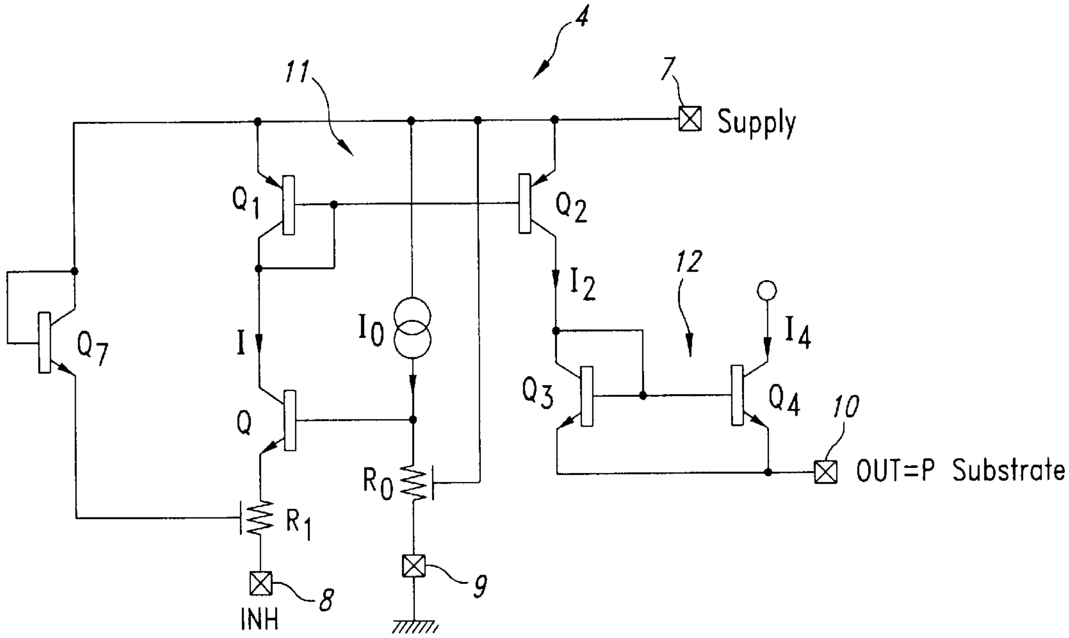
FIG. 5 shows a second embodiment of a portion of the inventive circuit structure.

FIG. 5 shows a modified embodiment of the circuit structure according to the invention. This embodiment may be regarded as alternative to that shown in FIG. 4, although it provides for an additional circuit portion. It should be noted, however, that the additional circuit portion shown in FIG. 5 forms an option, that is to say, is not strictly necessary to the operation of the inhibit circuitry of this invention.

Shown in FIG. 5 is an additional current mirror 12 which is connected between the collector terminal of the transistor Q2 and an output pin 10. This current mirror 12 is formed of a transistor pair Q3, Q4 which receives a mirrored current value I4. In particular, the transistor Q4 serves as an actuator of the inhibit action by performing a sink function, as explained hereinafter.

Figure 6:
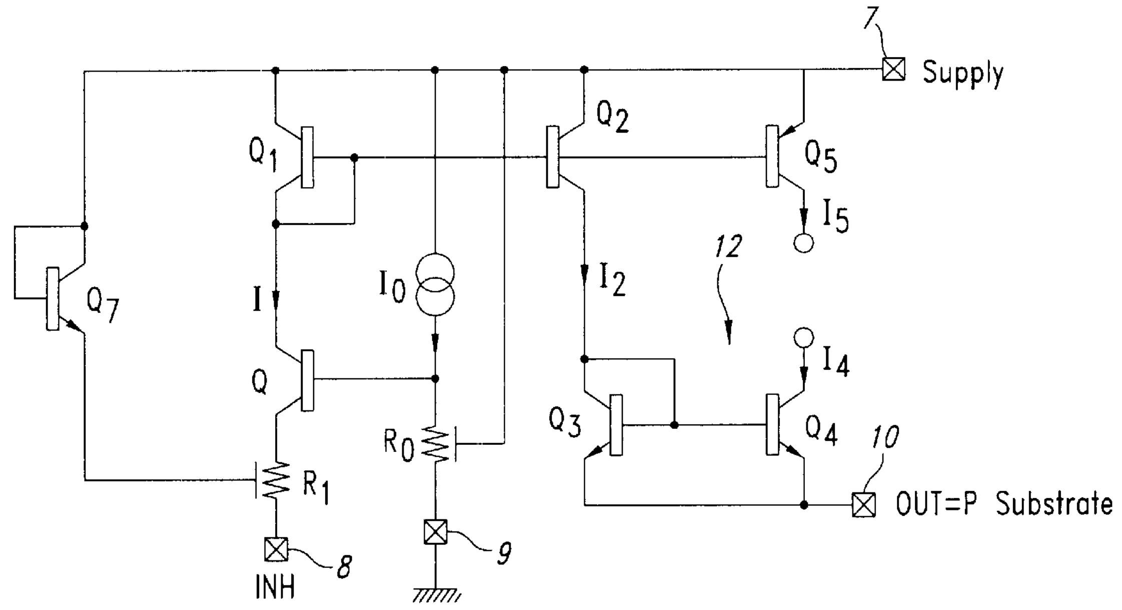
FIG. 6 is a detail view of a second modification that combines some of the features from the embodiments shown in FIGS. 4 and 5.

Advantageously, the schemes of FIGS. 4 and 5 may be combined together. FIG. 6 shows, as an example, a second modified embodiment including a fifth transistor Q5 connected in parallel with the transistor Q2, within the circuit diagram of FIG. 5. The transistor Q5 introduces another leg of the current mirror 11 which can be used for applying a combined source/sink action to the circuit 2 for which the inhibit effect is to be initiated.

The way in which the structure of these embodiments can implement a novel inhibit scheme will now be described in connection with its operation.

For the sake of simplicity, the base currents of the transistors will be regarded as of negligible import compared to the currents present in the circuit.

The current generator lo and resistor Ro jointly produce a stable voltage reference Vo given as:

$$Vo = Io * Ro[V] \quad (1)$$

A comparison of this reference Vo with the voltage being applied to the inhibit pin 8 from the outside gives a current I as:

$$I=(Vo-V_{BE-Q}-Vin)/R1[A] \quad (2)$$

The current I is then mirrored by the current mirror 11 into the current 12 being output from the collector of the transistor Q2. Where the mirroring ratio is 1, the current I2 is the same as the current I.

The transistor Q2 represents the actuating element that initiates the power-off action in one or more stages of the circuit 2 to be controlled, which circuit is connected electrically between the supply pin 7 and the output pin 10 presenting the substrate potential.

Thus, the presence or absence of the current I will produce the power-off or the power-on action:

$$I2>0 \Rightarrow Power_{13}Off[A] \quad (3)$$

$$I2=0 \Rightarrow Power_{13}On[A] \quad (4)$$

It should be noted here that the action of the circuit portion 4 is applied at a low-current node of the circuit 2 to be controlled. This means, as first approximation, that with I=0 in relation (2), the inhibit threshold voltage $V_{TH}$ will be given by:

$$0=(Vo-V_{BE\_Q}-Vin)/R1[A] \quad (5)$$

Substituting the value of Vo given by relation (1), it is:

$$V_{TH}=IoRo-V_{BE\_Q}[V] \quad (6)$$

And, since the value of $V_{BE\_Q}$ is approximately 0.7V:

$$V_{TH}=IoRo-0.7[V] \quad (7)$$

Therefore, by setting the switching threshold at a desired value, e.g., $V_{TH}$=1.4V as is typical of an inhibit TTL operated at $V_{Thmin}$=0.8V and $V_{THmax}$=2.0V, and setting Io=5 $\mu$ to minimize consumption, the value for the resistor Ro, which is 140 Kohms in the example, can be calculated from relation (7).

In conclusion:

$$V_{INH}<V_{TH} \Rightarrow Power\_Off[V] \quad (8)$$

$$V_{INH}>V_{TH} \Rightarrow Power\_On[V] \quad (9)$$

The current consumption $I_{OF}$ in the inhibit circuit portion 4 is given, in the power-off condition, by:

$$I_{OF}=Io+I+I2[A] \quad (10)$$

It follows from relations (2) and (10) that:

$$I_{OF}=Io+[(Vo-V_{BE\_Q}-Vin)/R1]+I2[A] \quad (11)$$

The value of R1 can be calculated from (11) to keep consumption low in the power-off condition. A condition of maximum consumption would be entered with the inhibit voltage $V_{INH}$ at a minimum.

Furthermore, in order to achieve a switching threshold which is stable with temperature, the current generator I should be suitably compensated for temperature variations, considering that the resistivity of resistors usually increases with temperature, whereas Vbe decreases with temperature (for a given current). Differentiating relation (6) with respect to temperature, it is:

$$dV_{INH}/dt=Ro\ dI/dT+Io\ dRo/dt-dVbe/dT\ [d/d] \quad (12)$$

Compensation of the inhibit threshold for temperature is achieved by equating relation (12) to zero, as follows:

$$0=Ro\ dI/dT+Io\ dRo/dT-dVbe/dt\ [d/d] \quad (13)$$

With the thermal drifts of the base-emitter voltage drop Vbe of transistor Q and the resistance Ro being both known, relation (13) will indicate what dependence on temperature T the current generator I should exhibit in order for the condition $V_{INH}$=0 to be met.

FIG. 4 illustrates, as mentioned, the instance of a power-off action being initiated by the output current I2 (source action) from the inhibit circuit portion 4.

FIG. 5, on the contrary, illustrates the instance of the power-off condition being produced by the action of an input current I4 (sink action) to the inhibit circuit portion 4. In this case, the current I would be mirrored into the current I4 by the mirror 12, itself referred to the substrate potential.

The actuator Q4 functions, therefore, as a sink to establish a power-off condition by "turning off" one or more stages of the circuit 2 to be controlled.

The embodiment of FIG. 6 illustrates a combination of the circuit schemes according to FIGS. 4 and 5. This combination is suitable for those instances where the power-off condition is to be established by the combined actions of a source current and a sink current. Compared to the scheme of FIG. 4, in the power-off condition, "consumption" legs would obviously be added in the embodiments of FIG. 5 and 6.

Figure 7:
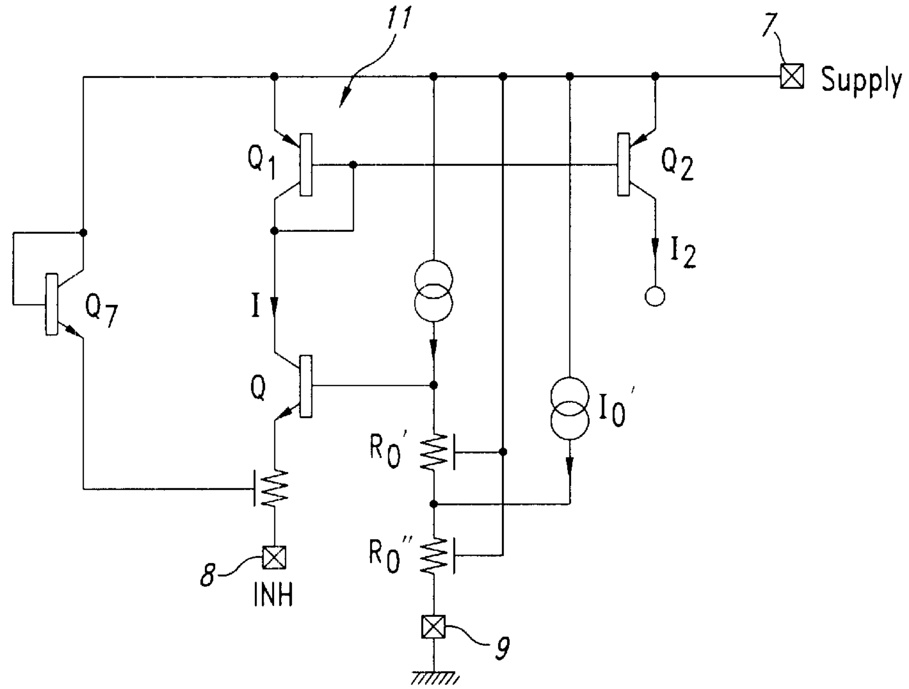
FIG. 7 is an improved circuit diagram for the embodiment shown in FIG. 3.

The circuit scheme of this invention also lends itself to introduce hysteresis in the switching of the inhibit signal. For this purpose, it will suffice to include a generator Io', and to split the resistor Ro into two discrete resistive elements Ro' and Ro" connected in series with each other, as shown in FIG. 7.

The generator lo' is arranged to be turned off upon power-off, thereby producing a difference in threshold voltage between switching the voltage $V_{INH}$ applied to the inhibit pin 8 from low to high and switching it from high to low, this difference being the hysteresis $V_H$, i.e.:

$$V_H=Io'*Ro''[V] \quad (14)$$

Figure 8:
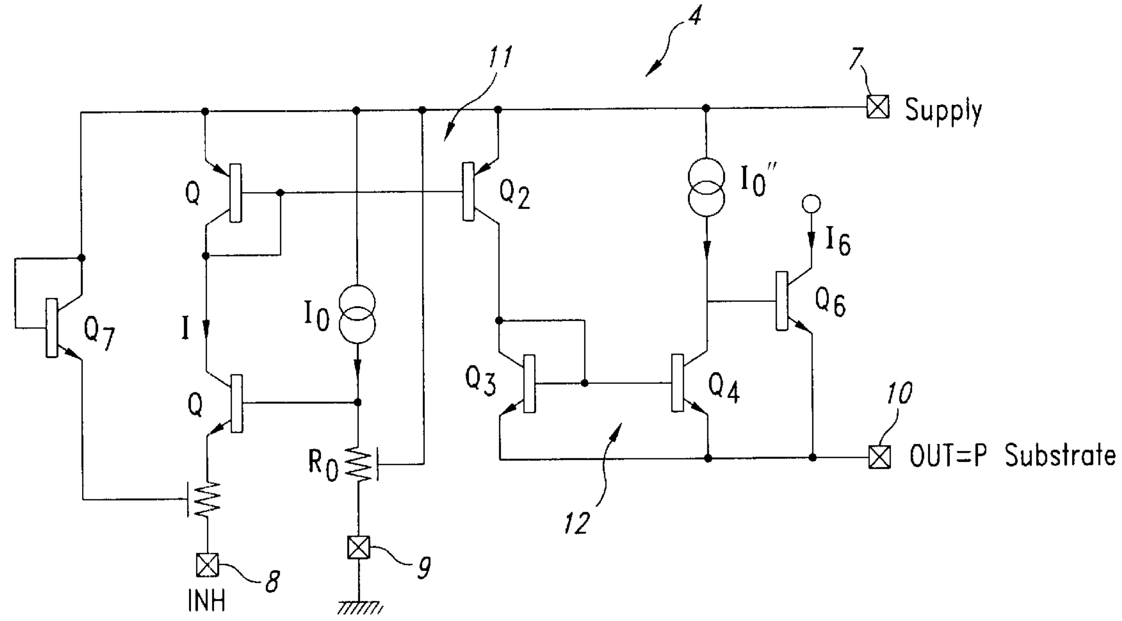
FIG. 8 is a schematic diagram of a further embodiment of the invention.

The circuit scheme of this invention is especially versatile in that it can even provide for reversal of the inhibit control logic. It will be enough, for this purpose, that the control signal be reversed downstream of the system, as shown schematically in FIG. 8. It can be seen that the embodiment of FIG. 5 has been modified in FIG. 8 by the addition of a current generator Io" and a sixth transistor Q6 which is connected between the current generator Io" and the output pin 10. In this case, the power-off action is brought about by turning on the transistor Q6, i.e.:

$$Io''>I4 \Rightarrow Power\_Off[A]tm\ (15)$$

The inhibit switching threshold is set here from the comparison of two currents, Io" and I4, as indicated by relation (15), which results in the imprecise and spread threshold value.

To now see how well the condition $V_{INH}>V_{SUPP}$ is met, when the following condition applies, for example:

$$V_{INH}=5V,\ V_{SUPP}=3[V] \quad (16)$$

The circuit is in the power-off state, the current I=0 because the transistor Q is "off", and the B-E junctions of the transistors Q7 and Q are reverse biased, thus preventing a parasitic PNP (Pbase-Nepy-Psubstrate) substrate transistor from being turned on at the resistor R1. In this way, both a current draw from the inhibit pin 8 to the substrate 3, and a current draw from the inhibit pin 8 to ground GND, can be avoided.

Figure 9:
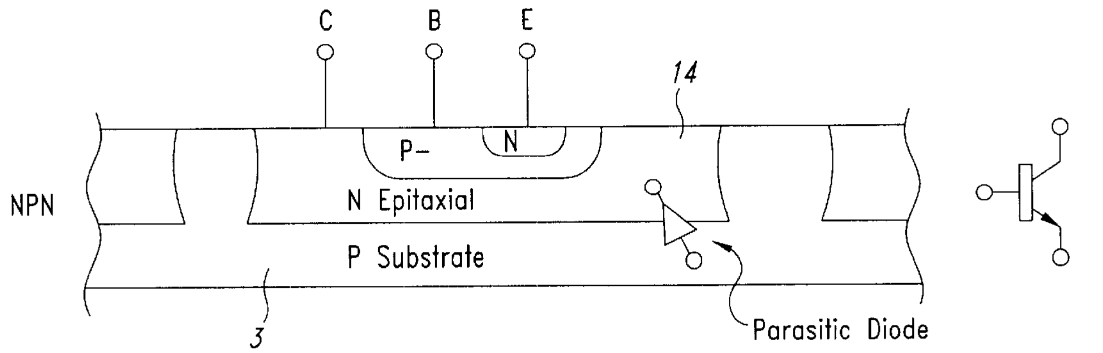
FIGS. 9, 10 and 11 are respective cross-sectional views of a portion of a semiconductor substrate incorporating portions of embodiments of the invention.
Figure 10:
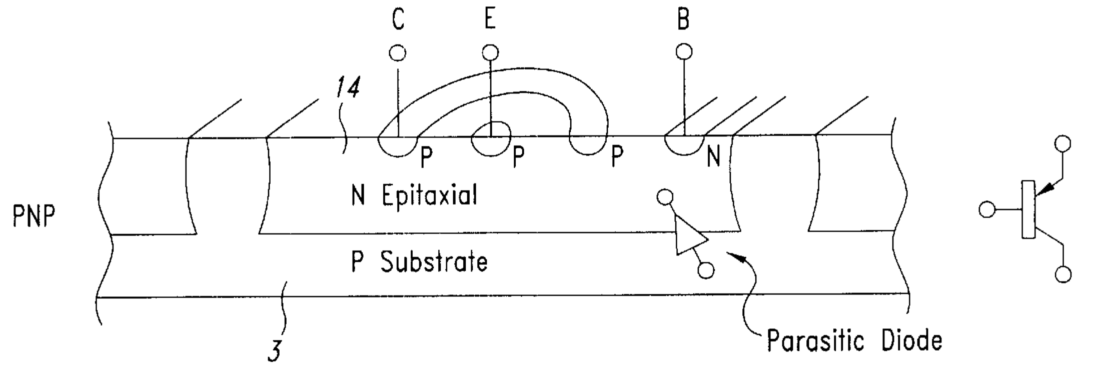
Figure 11:
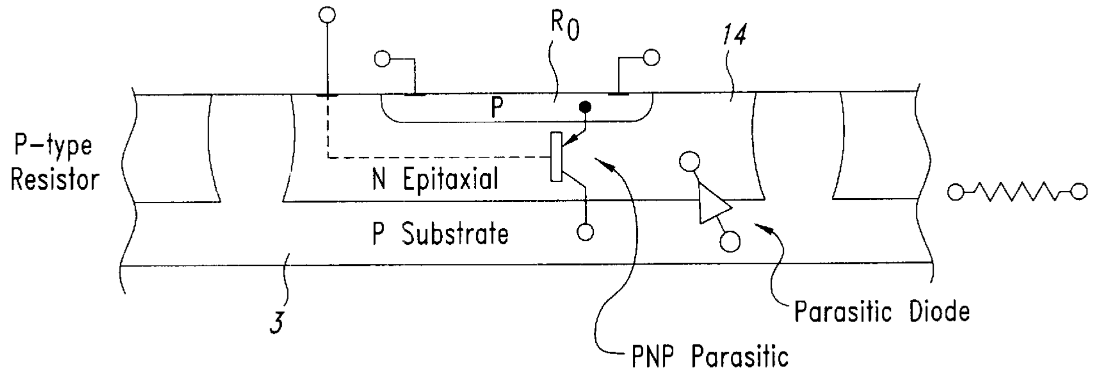

FIGS. 9 to 11 are respective cross-sectional views taken through a semiconductor substrate portion where electronic components are provided for use in the circuit structure shown in FIGS. 4–8. These views also show associated parasitic components which form the subject matter of the following discussion.

Assume that in practice of the previously described embodiment it is:

$$0 \leqq V_{SUB} \leqq V_{SUPP} - (V_{BE} + V_{CEsat})[V] \quad (17)$$

A condition for parasitic components not to be triggered on is that a Nepy well 14 should be at a higher than or the same potential as that of the substrate 3:

$$V_{EPY} \leqq V_{SUB}[V] \quad (18)$$

The resistors Ro, R1 may be applied lower than substrate potentials, provided that their epy well meets condition (18). This will prevent a parasitic PNP (Pbase-Nepy-Psubstrate), shown in FIG. 9, from being turned on. This condition is observed at both the resistor Ro (having its epy well located at the supply pin 7) and the resistor R1 (having its epy well at a Vbe from the supply Va through the diode Q7).

The epy well 14 of the transistor Q, being coincident with its collector, is at a Vbe from the supply Va through the transistor Q1. The epy well of the diode Q7, being coincident with its collector, is connected to the supply Va directly.

The epy well of the transistors Q1, Q2, representing their common base, is at a Vbe from the supply Va.

The emitters of NPN bipolar transistors can be brought to lower potentials than the substrate without problems.

The generators Io and Io', Io" are provided between the supply potential Va and the substrate potential Vout, with a collector PNP output which can be brought to a lower potential than the substrate without problems.

The remaining circuitry, operated between the supply potential Va and the substrate potential Vout is protected inherently from the triggering of parasitics toward the substrate.

To summarize, this circuit scheme presents a number of advantages by first creating an internal voltage reference relative to ground (thus ensuring compatibility with the external interface toward ground), and then comparing this reference with an inhibit threshold voltage, so as to make a decision about activating or not an inhibit circuit portion referred to the substrate.

The only stipulations for this inhibit circuit portion are that elements should be employed whose epitaxial well is always at a potential higher than or equal to that of the substrate, and that the condition whereby $V_{INH} > V_{SUPP}$ should be met.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A ground-compatible inhibit circuit structure for an integrated circuit formed in a semiconductor substrate that is unreferenced to a ground potential, comprising:

a stable internal reference voltage;

a circuit portion having a supply potential, the circuit portion operative to compare said stable internal reference voltage to an inhibit signal in order to block the integrated circuit upon the inhibit signal reaching or exceeding a predetermined threshold voltage value, even in a condition when a potential value of the inhibit signal exceeds the supply potential of the circuit portion; and an epitaxial layer covering the semiconductor substrate and accommodating components of the inhibit circuit structure, wherein the epitaxial layer is kept at a potential higher than or equal to that of a potential of the semiconductor substrate.

2. A ground-compatible inhibit circuit structure for an integrated circuit formed in a semiconductor substrate that is unreferenced to a ground potential, comprising:

a stable internal reference voltage;

a circuit portion having a supply potential, the circuit portion operative to compare said stable internal reference voltage to an inhibit signal in order to block the integrated circuit upon the inhibit signal reaching or exceeding a predetermined threshold voltage value, even in a condition when a potential value of the inhibit signal exceeds the supply potential of the circuit portion; and an epitaxial layer covering the semiconductor substrate and accommodating components of the inhibit circuit structure, wherein a potential of the semiconductor substrate obeys the following relation:

$$0 \leqq V_{SUB} \leqq V_{SUPP} - (V_{BE} + V_{CEsat})$$

wherein $V_{SUB}$ is a potential of the semiconductor substrate, $V_{SUPP}$ is the supply potential for the circuit portion, and wherein $V_{BE}$ and $V_{CEsat}$ are base-emitter and collector-emitter voltage drops of a bipolar transistor, respectively.

3. A ground-compatible inhibit circuit structure for an integrated circuit formed in a semiconductor substrate that is unreferenced to a ground potential, comprising:

a stable internal reference voltage;

a circuit portion having a supply potential, the circuit portion operative to compare said stable internal reference voltage to an inhibit signal in order to block the integrated circuit upon the inhibit signal reaching or exceeding a predetermined threshold voltage value, even in a condition when a potential value of the inhibit signal exceeds the supply potential of the circuit portion; and an epitaxial layer covering the semiconductor substrate and accommodating components of the inhibit circuit structure, wherein the stable internal reference voltage is provided by a current generator coupled in series with a resistor between a supply pin of the circuit portion and a ground pin of the circuit portion.

4. The structure according to claim 3, further comprising a transistor having a control terminal coupled to an interconnection node between the current generator and the resistor, a first conduction terminal connected, via a transistor current mirror, to a pin structured to receive the inhibit signal, and wherein a current value for controlling an inhibit function is sensed at a conduction terminal of the transistor current mirror.

5. The structure according to claim 4, further comprising a second current mirror connected to the transistor current mirror, and an output terminal coinciding with the semiconductor substrate.

6. The structure according to claim 3 wherein the resistor comprises a series of at least two resistors, and further comprising an additional current generator coupled between the supply pin and a node connecting the resistor series.

7. A ground-compatible inhibit circuit structure for an integrated circuit formed in a semiconductor substrate that is unreferenced to a ground potential, comprising:

a stable internal reference voltage;

a circuit portion having a supply potential, the circuit portion operative to compare said stable internal reference voltage to an inhibit signal in order to block the integrated circuit upon the inhibit signal reaching or exceeding a predetermined threshold voltage value, even in a condition when a potential value of the inhibit signal exceeds the supply potential of the circuit portion; and an epitaxial layer covering the semiconductor substrate and accommodating components of the inhibit circuit structure, wherein the inhibit circuit structure is coupled between a first pin adapted to receive a supply voltage, a second pin adapted to receive an inhibit function activating signal, a third pin structured to receive a ground reference voltage, and a fourth pin structured to provide an output coinciding with the semiconductor substrate of the integrated circuit.

8. An inhibit circuit for disabling an integrated circuit supplied by a supply reference voltage having a first voltage level and having an output coupled to a semiconductor substrate, both the inhibit circuit and the integrated circuit being formed in the substrate, the inhibit circuit comprising:

first, second and third terminals connected to receive the supply reference voltage, an inhibit signal, and a second reference voltage, respectively;

a stable voltage reference; and an activation circuit coupled to the stable voltage reference, the integrated circuit, and the inhibit signal, the activation circuit being structured to disable the integrated circuit when the inhibit signal has a voltage level that is higher than a threshold voltage, and maintain the disabling even if the voltage level is higher than the first voltage level of the supply reference voltage, wherein the stable voltage reference comprises a current generator and a first resistance coupled in series between the first terminal and the third terminal and having a node between them, and the activation circuit comprising:

a first switching transistor having a control terminal coupled to the node;

a second resistance coupled between the second terminal and a conduction terminal of the first transistor; and a current mirror including a first mirror transistor coupled between another conduction terminal of the first switching transistor and the first terminal, the current mirror also including a second mirror transistor.

9. The inhibit circuit of claim 8 wherein the first and second resistances are formed in respective wells in an epitaxial layer, and wherein the activation circuit further comprises a connection between the first terminal and the epitaxial layer.

10. The inhibit circuit of claim 9 wherein the connection between the first terminal and the epitaxial layer comprises a diode-connected transistor.

11. The inhibit circuit of claim 10, further comprising:

a second current mirror including a third mirror transistor coupled to the second mirror transistor, and the second current mirror including a fourth transistor coupled to a fourth terminal that is structured to transmit an output signal of the inhibit circuit.

12. The inhibit circuit of claim 11 the fourth terminal is directly coupled to the substrate.

* * * * *